(12) United States Patent
Iinuma et al.

(10) Patent No.: US 6,924,518 B2
(45) Date of Patent: Aug. 2, 2005

(54) SEMICONDUCTOR DEVICE AND METHOD OF MANUFACTURING THE SAME

(75) Inventors: Toshihiko Iinuma, Yokohama (JP); Ichiro Mizushima, Yokohama (JP); Mitsuaki Izuha, Yokohama (JP); Kiyotaka Miyano, Fujisawa (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/743,006

(22) Filed: Dec. 23, 2003

(65) Prior Publication Data

US 2005/0006637 A1 Jan. 13, 2005

(30) Foreign Application Priority Data

Jul. 11, 2003 (JP) ........................................ 2003-273603

(51) Int. Cl.[7] .............................................. H01L 29/80
(52) U.S. Cl. ...................... 257/284; 257/412; 438/300; 438/655
(58) Field of Search .............................. 257/412, 383, 257/384; 438/300, 301, 655

(56) References Cited

U.S. PATENT DOCUMENTS

| 5,496,750 | A | * | 3/1996 | Moslehi ...................... 438/297 |
| 6,303,450 | B1 | * | 10/2001 | Park et al. .................. 438/300 |
| 6,787,864 | B2 | * | 9/2004 | Paton et al. ................ 257/412 |

FOREIGN PATENT DOCUMENTS

JP 2000-150669 5/2000
JP 2002-124665 4/2002

OTHER PUBLICATIONS

Laveant, et al., "Engineering the Diffusion Behavior of Dopants (B, Sb) in Silicon by Incorporation of Carbon," *Nucl. Instrum. Methods Phys. Res. B*, (186) 292–297 (2002).

Shao, et al., "Boron Diffusion in Silicon: The Anomalies and Control by Point Defect Engineering," *Materials Science and Engineering*, (R42) 65, 101–103, and 112 (2003).

Stolk, et al., "Carbon Incorporation in Silicon for Suppressing Interstitial–Enhanced Boron Diffusion," *Appl. Phys. Lett.*, (66) 1370–1372 (1995).

* cited by examiner

Primary Examiner—Sara Crane
(74) Attorney, Agent, or Firm—Finnegan, Henderson, Farabow, Garrett & Dunner, L.L.P.

(57) ABSTRACT

There is disclosed is a semiconductor device which comprises a semiconductor substrate, isolation regions formed within the semiconductor substrate to define the active region, a pair of impurity diffusion regions formed within the element region in a manner to have surfaces elevated from the isolation region, a SiGe film formed on an upper surface of the impurity diffusion region so as to cover partly the side surface of the impurity diffusion region, a Ge concentration in the SiGe film being higher at a lower surface of the SiGe film than at an upper surface of the SiGe film, a metal silicide layer formed on the SiGe film, and a gate electrode formed in the active region of the semiconductor substrate with a gate insulating film interposed therebetween and having a sidewall insulating film formed on the side surface.

22 Claims, 6 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2003-273603, filed Jul. 11, 2003, the entire contents of which are incorporated herein by reference.

BACKGROUND OF THE INVENTION

1. Field of the Invention

The present invention relates to a semiconductor device, particularly, to a MIS (Metal Insulator Semiconductor) type FET (Field Effect Transistor) having a silicide film in an upper portion of the source-drain diffusion layers.

2. Description of the Related Art

In recent years, an elevated source-drain technology is proposed in order to suppress the problem in respect of a junction leak defect of a transistor.

The MOS type FET device having an elevated source-drain structure is manufactured by the process shown in, for example, FIGS. 1A to 1E.

Figure 1A:
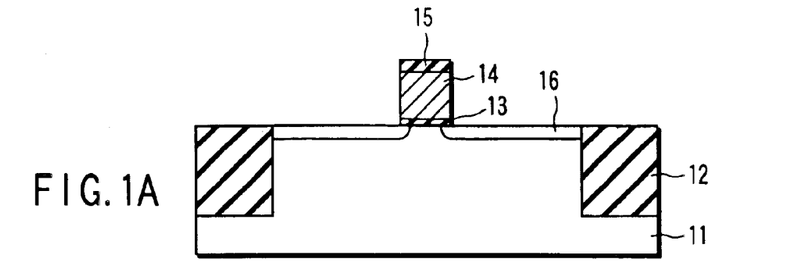
FIGS. 1A to 1E are cross sectional views collectively showing the conventional process of forming an elevated source-drain structure.

In the first step, an isolation region 12 consisting of a silicon oxide film is formed in a semiconductor substrate 11, as shown in FIG. 1A. A gate structure is formed on the semiconductor substrate 11 by laminating a gate insulating film 13, a gate electrode 14, and a gate electrode cap silicon oxide film 15 on the semiconductor substrate 11 in the order mentioned. Then, an impurity is implanted into the semiconductor substrate 11 with the gate structure used as a mask so as to form a first diffusion region 16 on the semiconductor substrate 11.

Figure 1B:
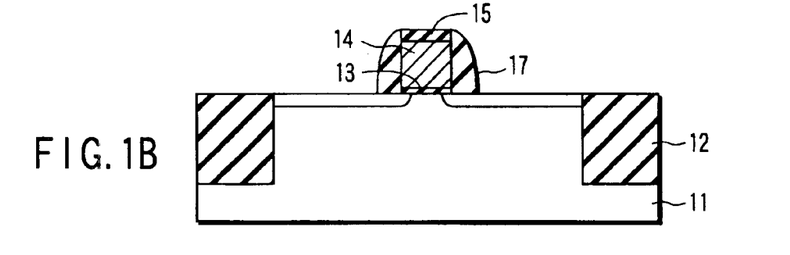
Figure 1C:
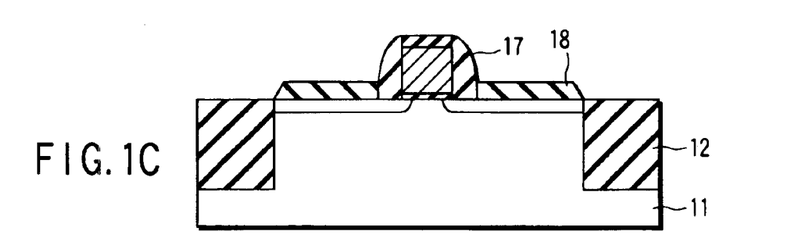

In the next step, a sidewall insulating film 17 is formed on the side surface of the gate electrode 14, as shown in FIG. 1B, followed by forming a mono-crystalline semiconductor film 18 on the first diffusion region 16, as shown in FIG. 1C. The mono-crystalline semiconductor film 18 can be formed by a selective epitaxial CVD technology using silicon or silicon-germanium.

Figure 1D:
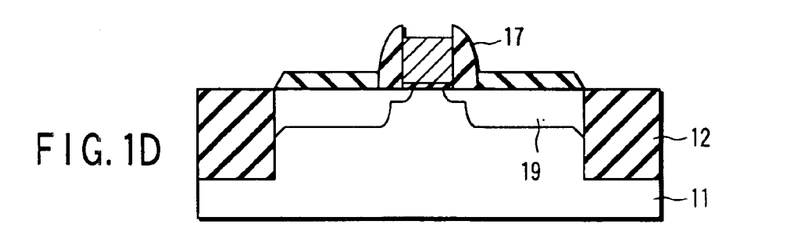

After formation of the semiconductor film 18, the gate electrode cap silicon oxide film 15 is removed, followed by implanting an impurity into the semiconductor substrate. As a result, a second diffusion region 19 is formed within the semiconductor substrate 11. In this step, the impurity is also introduced into the gate electrode 14 and the mono-crystalline semiconductor film 18.

Figure 1E:
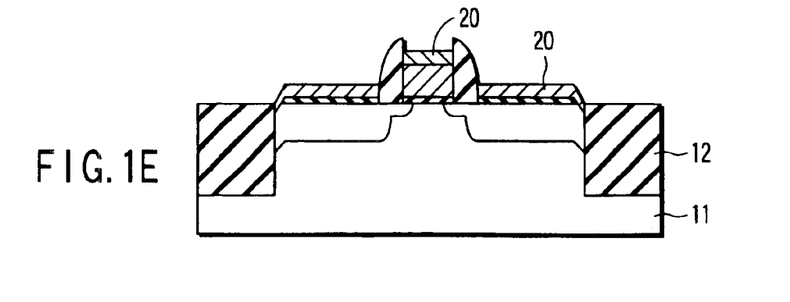

In the next step, a metal film (not shown) for forming a silicide film is deposited on the entire surface of the resultant structure, followed by applying a heat treatment to the metal film. Finally, the excess portion of the metal film is selectively removed so as to form a silicide film 20 on the surfaces of the gate electrode 14 and the mono-crystalline semiconductor film 18, as shown in FIG. 1E.

As shown in the drawing, the source-drain diffusion layers are constructed to have surfaces elevated by the selective epitaxial growth technology of silicon. As a result, it is possible to increase the margin relative to the junction leak current generation.

However, in order to form a silicon film uniformly while maintaining the selectivity on the silicon layer and on the insulating film, it is necessary for the selective epitaxial growth process of silicon to be carried out under the condition of high temperatures not lower than 850° C. It should be noted that, if such a high temperature process is carried out, the first diffusion region 15, which is required to maintain a shallow junction depth of the diffusion layer, is expanded deep into the semiconductor substrate 11 so as to lead to deterioration of the device characteristics.

In order to avoid the inconvenience described above, proposed is a technology that the junction depth of the source-drain regions are made equal to or shallower than the junction depth of the diffusion region.

Also proposed is to form a polycrystalline silicon (polysilicon) layer between a SiGe film and a $CoSi_2$ layer in the silicide gate so as to lower the resistance. However, in the case of forming a silicide film on the SiGe film, it is difficult to suppress the deterioration of the morphology.

BRIEF SUMMARY OF THE INVENTION

A semiconductor device according to one embodiment of the present invention comprises:

a semiconductor substrate;

an isolation region formed within the semiconductor substrate to define an active region;

a pair of impurity diffusion regions formed within the active region in contact with the isolation regions, the impurity diffusion regions having surfaces elevated from the isolation region;

a SiGe film formed on an upper surface of the impurity diffusion region so as to cover partly the side surface of the impurity diffusion region, a Ge concentration in the SiGe film being higher at a lower surface of the SiGe film than at an upper surface of the SiGe film;

a metal silicide layer formed on the SiGe film; and a gate electrode formed in the active region of the semiconductor substrate with a gate insulating film interposed therebetween and having a sidewall insulating film formed on the side surface.

A semiconductor device according to another embodiment of the present invention comprises:

a semiconductor substrate;

an isolation region formed within the semiconductor substrate to define the active region;

a pair of impurity diffusion regions formed within the active region in contact with the isolation region;

a C-containing SiGe film formed on the upper surfaces of the pair of the impurity diffusion regions;

a C-containing metal silicide layer formed on the C-containing SiGe film; and a gate electrode formed in the active region of the semiconductor substrate with a gate insulating film interposed therebetween and having a sidewall insulating film formed on the side surface thereof.

A method for manufacturing a semiconductor device according to one embodiment of the present invention comprises:

forming a gate electrode above an active region of a semiconductor substrate separated by an isolation region, with a gate insulating film interposed between the active region and the gate electrode;

forming a sidewall insulating film on the side surface of the gate electrode;

forming an impurity diffusion region by introducing an impurity into the semiconductor substrate, with the sidewall insulating film and the gate electrode used as a mask;

removing an upper portion of the isolation region so as to partially expose a side surface of the impurity diffusion region to the outside;

forming a SiGe film on an upper surface of the impurity diffusion region so as to cover partly the side surface of the impurity diffusion region, a Ge concentration in the SiGe film being higher at a lower surface of the SiGe film than at an upper surface of the SiGe film;

forming a metal film on the entire surfaces of the SiGe film and the gate electrode;

applying a heat treatment to the semiconductor substrate having the metal film formed thereon so as to convert an upper region of the SiGe film into a metal silicide layer selectively, a lower region of the SiGe film being left unchanged;

forming a dielectric film as a pre-metal dielectric on the entire surface of the semiconductor substrate having the metal silicide layer formed thereon;

forming a contact hole in the dielectric film, followed by filling the contact hole with a conductive material; and forming an interconnect layer connected to the conductive material filled in the contact hole.

DETAILED DESCRIPTION OF THE INVENTION

As a result of an extensive research on the combination of a so-called "SiGe elevated source-drain technology", in which the source-drain layers are elevated at a low temperature by forming a SiGe film by a selective epitaxial growth, and the salicide technology, the present inventors have found the situation described in the following.

First of all, it has been found that the following problem is generated if the silicon epitaxial growth technology is simply replaced by the SiGe technology in the elevated source-drain process.

Figures 2A, 3A:
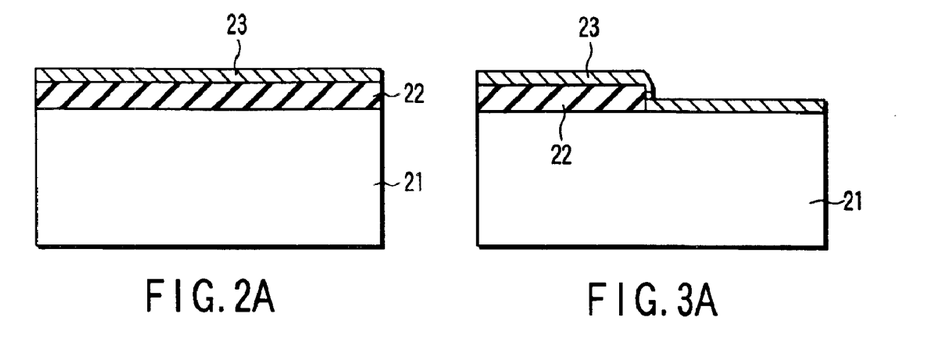
FIGS. 2A and 2B are cross sectional views collectively showing the formation of a NiSi film on a SiGe film.
FIGS. 3A and 3B are cross sectional views collectively showing the formation of a NiSi film on a SiGe/Si film.
Figures 2B, 3B:
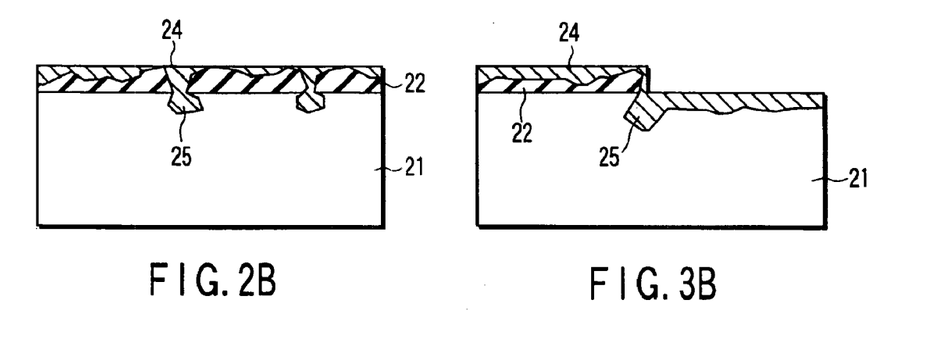

Specifically, where a NiSi film is formed on a thin SiGe film, a SiGe film 22 and a Ni film 23 are formed successively on a silicon substrate 21 as shown in FIG. 2A, followed by applying a heat treatment. It should be noted that the interface between a NiSi film 24 and the SiGe film 22 cannot be made completely flat because of the influence of, for example, the grain boundary. In other words, the interface noted above is rendered irregular. If the NiSi film 24 protruding downward extends to reach the silicon substrate 21 even if partly, a biting 25 of the NiSi film 24 is generated, as shown in FIG. 2B. The particular problem is generated because the binding energy of Ni—Ge is smaller than the binding energy of Ni—Si and, thus, Ni and Ge are unlikely to react each other.

The problem pointed out above is rendered particularly prominent in the case of forming a NiSi film at the boundary between a SiGe layer and a Si layer. The particular situation covers the case where the Ni film 23 is deposited on the silicon substrate 21 having the SiGe film 22 formed on a part of the surface as shown in FIG. 3A for carrying out the silicidation. In this case, a marked biting 25 of the NiSi film 24 is generated in the boundary region between the SiGe film 22 and the silicon substrate 21, as shown in FIG. 3B.

Figure 4:
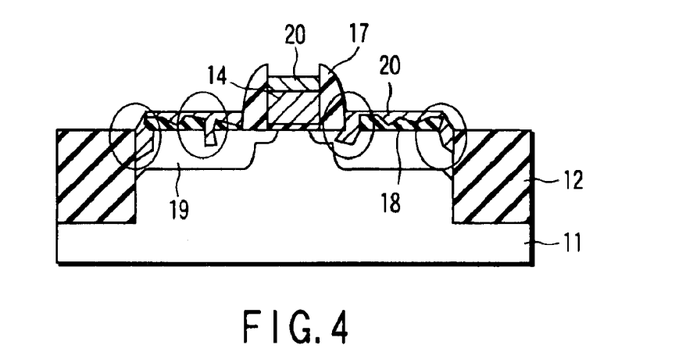
FIG. 4 is a cross sectional view schematically showing the construction of the conventional MOS type FET.

Such being the situation, the biting 25 of the NiSi film is generated as shown in FIG. 4 in the MOS type FET device. Particularly, a facet is generated in the vicinity of each of the gate electrode 14 and isolation region 12 in the stage of the selective epitaxial growth of the SiGe film. As a result, the situation described above with reference to FIG. 3B tends to take place. In other words, a serious problem is generated that the morphology of the NiSi film 20 is markedly deteriorated, which renders poor the junction leak characteristics of the device.

The present inventors have paid attention to the situation that the binding energy of Ni—Ge is smaller than the binding energy of Ni—Si so as to make it possible to improve the surface morphology in forming a silicide film on the SiGe film.

The concept relating to one embodiment of the present invention will now be described with reference to FIGS. 5A and 5B.

Figure 5A:
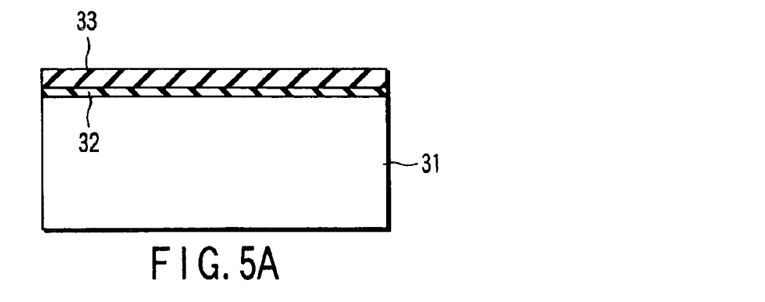
FIGS. 5A and 5B are cross sectional views collectively showing the concept of the manufacturing method of a semiconductor device according to one embodiment of the present invention.

In the first step, first and second SiGe films 32 and 33 differing from each other in the Ge concentration are formed on a silicon substrate 31, as shown in FIG. 5A. It is possible for the SiGe films to be a film formed by an epitaxial growth or a poly-SiGe film.

It is desirable for the Ge concentration in the first SiGe film 32 to be higher by at least 10 atomic % than that in the second SiGe film 33. If the difference in the Ge concentration is not larger than 10 atomic %, it is difficult to maintain flat the lower surface of the second SiGe film 33. On the other hand, if the Ge concentration exceeds 30 atomic %, the film itself tends to be etched in the acid-alkali washing step such as a treatment using a mixture of sulfuric acid and hydrogen peroxide, a mixture of hydrochloric acid and hydrogen peroxide, hydrofluoric acid, or a mixture of ammonia and hydrogen peroxide included in the manufacturing process of a semiconductor device. It is desirable for the first SiGe film 32 to have a thickness of 5 to 20 nm. It is possible to determine the thickness of the first SiGe film 32 in accordance with the margin relative to the agglomeration of NiSi formed in the subsequent step. Where the temperature of the heat treating process performed after formation of the NiSi film is suppressed to 500° C. or lower, it suffices for the first SiGe film 32 to have a thickness of 5 to 20 nm in order to improve the surface morphology and to decrease the contact resistance.

The second SiGe film 33 has a relatively low Ge concentration, and it is desirable for the second SiGe film 33 to have a Ge concentration falling within a range of between about 5 and 20 atomic %. Where the Ge concentration is lower than 5 atomic %, it is difficult to form easily the second SiGe film 33 by employing a heat treating step carried out under temperatures not higher than 800° C. in the case of forming the second SiGe film 33 by the selective epitaxial growth. On the other hand, it is necessary for the Ge concentration to be not higher than 20 atomic % in order to ensure at least 10 atomic % of the difference in the Ge concentration between the second SiGe film 33 and the first SiGe film 32. It suffices for the thickness of the second SiGe film 33 to be substantially equal to or to be slightly larger than the thickness of a NiSi film formed in the subsequent step.

Figure 5B:
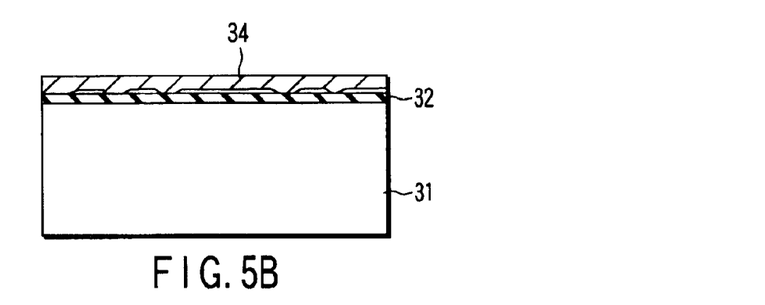

A NiSi film 34 is formed as shown in FIG. 5B by depositing a Ni film (not shown) on the second SiGe film 33, followed by applying a heat treatment to the Ni film at 400 to 500° C. The reaction between Ni and Si is retarded with increase in the SiGe concentration. Likewise, the reaction between Ni and SiGe is retarded with increase in the SiGe concentration. As a result, the lower edge of the NiSi film 34 is incapable of breaking the first SiGe film 32 containing Ge at a high concentration so as to remain within the second SiGe film 33 containing Ge at a low concentration.

As a result, the NiSi film 34 is prevented from biting into the silicon substrate 31 so as to ensure a satisfactory surface morphology.

It is possible for the SiGe film of a laminate structure containing two layers differing from each other in the Ge concentration to be replaced by a single SiGe film having a gradient in the Ge concentration. The particular construction will now be described with reference to FIGS. 6A and 6B.

Figure 6A:
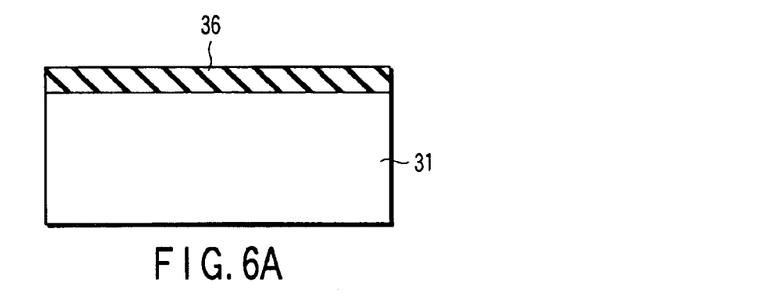
FIGS. 6A and 6B are cross sectional views collectively showing the concept of the manufacturing method of a semiconductor device according to one embodiment of the present invention.

In the first step, a SiGe film 36 is formed on the silicon substrate 31, as shown in FIG. 6A. The SiGe film 36 thus formed has the highest Ge concentration on the lower surface in contact with the silicon substrate 31, and the Ge concentration is lowered toward the upper surface. The SiGe film having the particular Ge concentration gradient can be formed by carrying out, for example, a CVD process while decreasing the supply rate of the Ge raw material. It is desirable for the Ge concentration to fall within a range of between the highest concentration 30 atomic % and the lowest concentration of 5 atomic % because of the reason described above. Also, it is desirable for the SiGe film 36 to have a thickness larger than the thickness of a NiSi film formed in the subsequent step. To be more specific, the thickness of the SiGe film 36 can be set at about (thickness of NiSi film)+(5 to 20 nm).

Figure 6B:
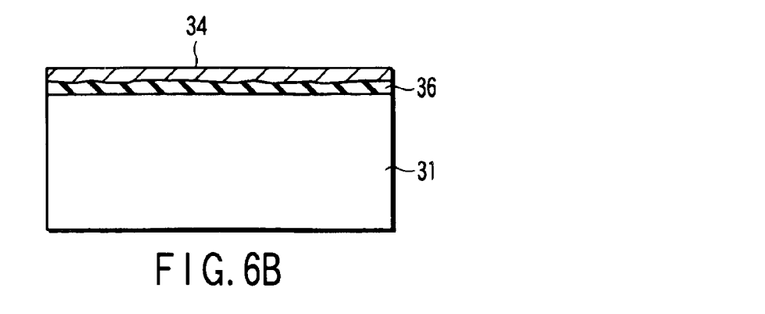

In the next step, a Ni film (not shown) is deposited on the SiGe film 36, followed by applying a heat treatment to the Ni film under the temperature referred to above so as to form a NiSi film 34 as shown in FIG. 6B. As described previously, the reaction between Ni and Si and the reaction between Ni and SiGe are retarded with increase in the SiGe concentration. As a result, the lower edge of the NiSi film 34 does not intrude into that region of the SiGe film 36 which has a high Ge concentration but remains within the region containing Ge in a low concentration.

It is possible to set the difference in thickness between the SiGe film 36 and the NiSi film formed in the subsequent step in accordance with the margin relative to the agglomeration of NiSi, which is generated in the heat treating step after formation of the NiSi film. Where the temperature in the heat treating step after formation of the NiSi film is suppressed to 500° C. or lower, it suffices for the difference in thickness noted above to be about 5 to 20 nm.

In the embodiment of the present invention described above, it is made possible to ensure the flatness of the interface between the SiGe film and the NiSi film formed on the SiGe film by controlling the concentration of Ge in the SiGe film.

Further, it is possible to suppress as follows the deterioration in the morphology of the NiSi film, which is derived from the facet caused by the formation of the SiGe film by the selective epitaxial growth.

FIGS. 7A to 7H are cross sectional views collectively showing the manufacturing process of a semiconductor device according to one embodiment of the present invention.

Figure 7A:
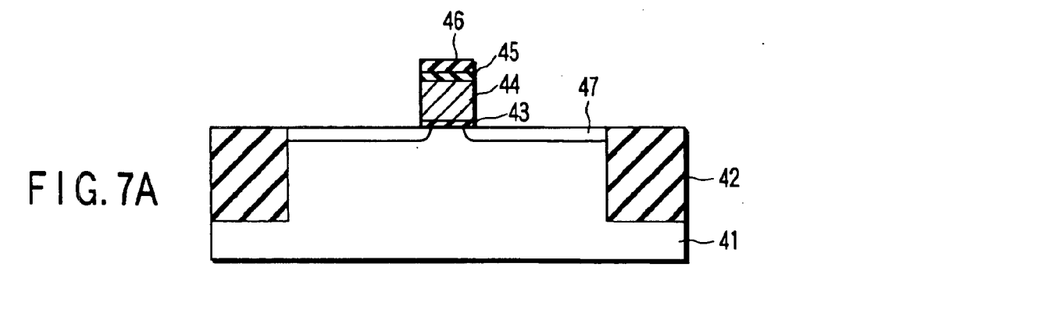
FIGS. 7A to 7H are cross sectional views collectively showing the manufacturing method of a semiconductor device according to one embodiment of the present invention.

In the first step, an isolation region 42 consisting of a silicon oxide film is formed on the surface of a semiconductor substrate 41, as shown in FIG. 7A. Also, a gate structure is formed on the semiconductor substrate 41 by laminating a gate insulating film 43, a gate electrode 44 formed of polysilicon, a silicon nitride film 45 and a silicon oxide film 46. Then, a first diffusion region 47 is formed by implanting an impurity into the semiconductor substrate 41 with the gate structure noted above used as a mask.

Figure 7B:
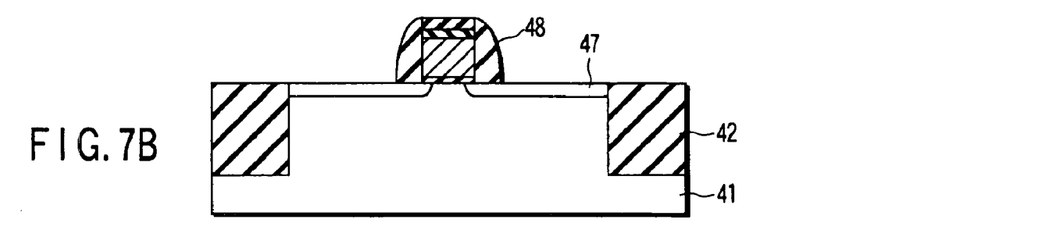
Figure 7C:
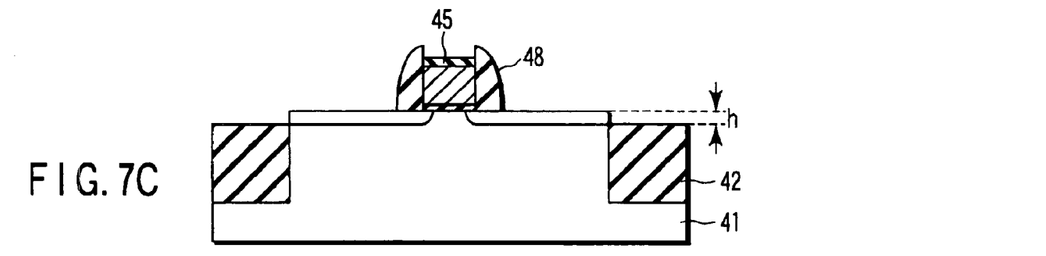

In the next step, a sidewall insulating film 48 consisting of a silicon nitride film is formed to surround the gate electrode 44, as shown in FIG. 7B, followed by applying an isotropic etching using, for example, a dilute hydrofluoric acid so as to remove the surface region of the isolation region 42, with the result that the side surface of the first diffusion region 47 is exposed to the outside, as shown in FIG. 7C. In this step, the silicon oxide film 46 constituting the uppermost layer of the gate structure is also removed so as to expose the silicon nitride film 45 to the outside.

It should be noted that the surface of the first diffusion region 47 is caused to protrude upward by the height "h" from the surface of the isolation region 42 as shown in FIG. 7C as a result of the isotropic etching.

Figure 7D:
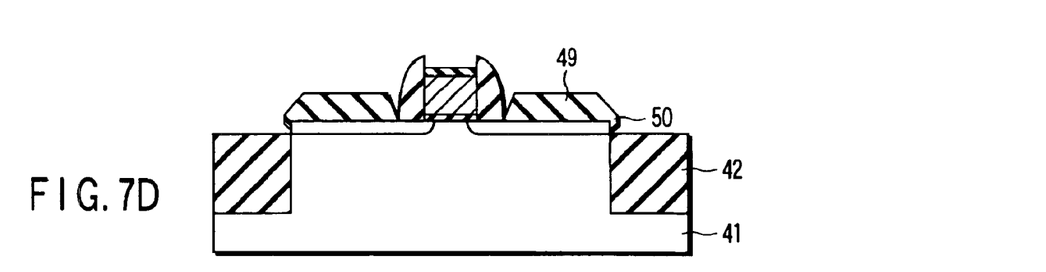

In the next step, a SiGe film 49 is formed on the first diffusion layer 47 by the selective epitaxial growth so as to upheave the surfaces of the regions for forming the source-drain diffusion layers, as shown in FIG. 7D. The Ge concentration in the SiGe film 49 is controlled to be lowered toward the upper surface by the technology described previously.

Since the SiGe film 49 is formed by the selective epitaxial growth, facets are formed in the SiGe film 49 in the vicinity of the gate electrode and in the vicinity of the isolation region. Since the side surface of the first diffusion region 47 is exposed to the outside, an overhanging portion 50 of the SiGe film 49 is formed in the vicinity of the isolation region 42. In order to protect the facet on the side of the isolation region, the thickness of the SiGe film 49 is required to fall within a range of between the height h referred to above and 2h. On the other hand, the maximum thickness "w" of the SiGe film 49 formed on the side surface of the first diffusion region 47 is not larger than the height h of the protruding portion referred to above because the SiGe film 49 is formed by the selective epitaxial growth.

Such being the situation, it is necessary to ensure at least 5 nm, desirably at least 10 nm, of the height h of the protruding portion in order to prevent the protrusion of the NiSi layer by setting the maximum thickness w of the SiGe film 49 formed on the side surface of the first diffusion region 47 at 5 nm or more. It should also be noted that, if the height h of the protruding portion is larger than required, the lower surface of the gate electrode 44 formed on the isolation region 42 is exposed to the outside so as to give rise to the problem that the contact portion between the gate insulating film 43 and the isolation region 42 is etched. It follows that it is desirable for the height h of the protruding portion to be not larger than the width of the sidewall insulating film 48 consisting of a silicon nitride film.

Further, in order to suppress the parasitic capacitance and the short circuit between the GC-S/D, it is desirable for the thickness of the SiGe film 49 to be smaller than the thickness of the gate electrode 44.

Figure 7E:
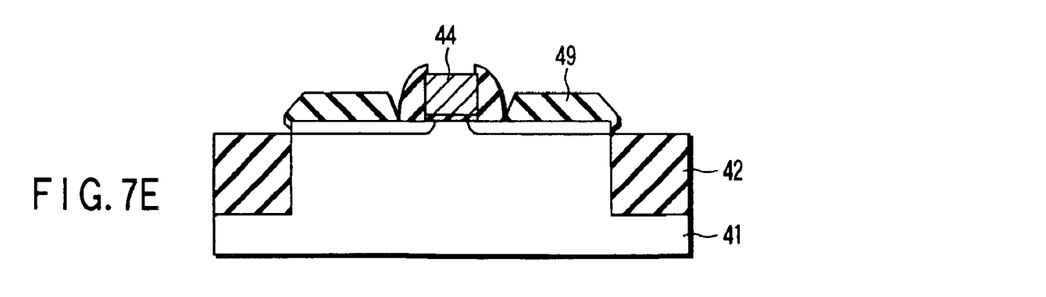

In the next step, a treatment with, for example, a hot phosphoric acid is applied so as to remove by etching the silicon nitride film 45 in an upper portion of the gate structure, thereby allowing the gate electrode 44 to be exposed to the outside, as shown in FIG. 7E. In this etching step, the sidewall 48 consisting of a silicon nitride film is also etched to some extent so as to be made smaller than before.

Figure 7F:
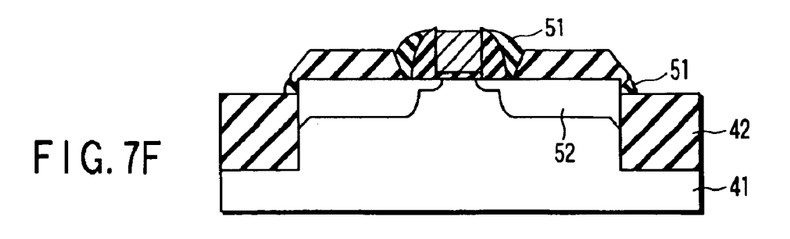

Then, a silicon oxide film is deposited on the entire surface, followed by applying an anisotropic etching such as a RIE to the silicon oxide film so as to form a sidewall 51 made of a silicon oxide film between the sidewall 48 made of a silicon nitride film and the SiGe film 49 as shown in FIG. 7F. In this step, the sidewall 51 made of a silicon oxide film is also formed below the overhanging portion 50 formed at the edge portion of the isolation region 42. It is possible for the sidewall 51 to be formed of a silicon nitride film. Further, source-drain contact diffusion layers 52 are formed by an ion implantation, followed by a heat treatment such RTA. It is desirable for the source-drain contact diffusion layer 52 to be formed such that the pn junction plane is positioned within the silicon substrate 41 below the SiGe film 49 in order to ensure with a high controllability the distance between the lower surface of the silicide film and the pn junction plane.

Figure 7G:
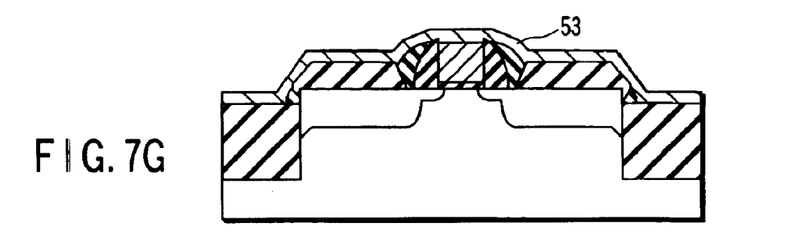

After the surfaces of the exposed silicon substrate 41 and the gate electrode 44 are washed with, for example, a dilute hydrofluoric acid, a metal film 53 such as a Ni film for achieving a silicidation is deposited on the entire surface, as shown in FIG. 7G. The facet portions 50 formed in the SiGe film 49 in the vicinity of the gate electrode and at the edge of the isolation region are covered with the sidewall 51 consisting of a silicon oxide film. Such being the situation, the metal film 53 is prevented from being brought into contact with these facet portions.

Figure 7H:
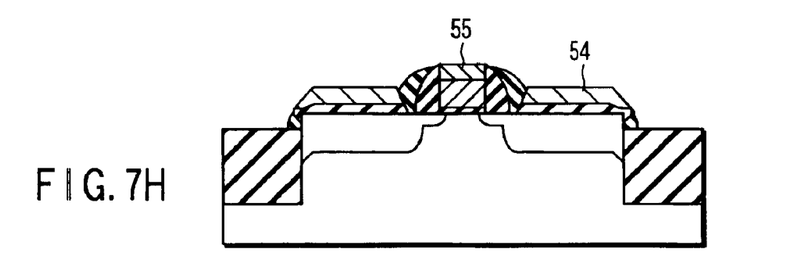

In the next step, a heat treatment is applied to the metal film 53 at 400 to 500° C. so as to permit Ni to react with silicon or SiGe, thereby the upper region of the SiGe film 49 is converted into a metal silicide layer. On the other hand, the lower region of the SiGe film 49 is left unchanged. The unreacted Ni on the SiGe film 49 is selectively removed by etching. As a result, metal silicide films 54 and 55 each consisting of, for example, NiSi are formed on the SiGe film 49 and the gate electrode 44, respectively, as shown in FIG. 7H. The metal silicide film 55 formed on the gate electrode 44 differs in composition from the metal silicide film 54. In this case, the morphology of the NiSi film 54 formed on the SiGe film 49 is maintained satisfactory by the modulation of the Ge concentration referred to previously and the protection of the facet portions.

Figure 8:
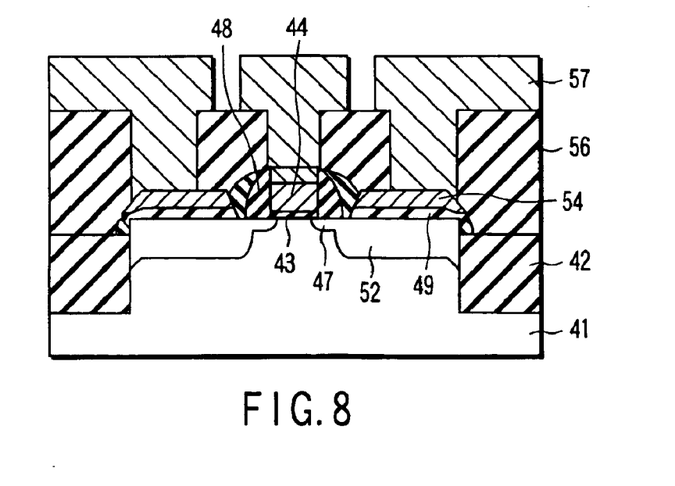
FIG. 8 is a cross sectional view schematically showing the construction of a semiconductor device according to one embodiment of the present invention.

Finally, a dielectric film 56 as a PMD (pre-metal dielectric) is deposited on the entire surface, followed by planarizing the surface of the dielectric film 56 so as to form contact holes extending to reach the gate electrode, the source electrode and the drain electrode of the MOSFET device. A conductive material is buried in each of these contact holes so as to form an interconnect layer 57, thereby finishing the manufacture of the transistor according to the first embodiment of the present invention, as shown in FIG. 8.

As described above, in forming the elevated source-drain structure that can be formed at a low temperature in this embodiment of the present invention, a gradient of the Ge concentration is formed in the SiGe film such that the Ge concentration is lowered toward the upper surface of the SiGe film. Further, the side surface of the region in which the SiGe film is to be formed (i.e., impurity diffusion region) is exposed to the outside in advance so as to form an overhanging portion in stage of forming the SiGe film by the selective epitaxial growth. As a result, the embodiment of the present invention has made it possible to form a silicide film such as a NiSi film having a satisfactory film morphology. It follows that it is possible to suppress the deterioration of the device characteristics. The particular effect can be further enhanced by covering the facet portions formed in the overhanging portion and in the vicinity of the gate electrode with an insulating film.

When it comes to a MOS type FET device having a gate length of, for example, 30 nm in the semiconductor device according to this embodiment of the present invention, it has been confirmed that satisfactory device characteristics can be obtained if the thickness of each layer falls within the range given below. Specifically, the height of the gate electrode formed of polysilicon should fall within a range of between 100 nm and 150 nm. The protruding height of the first diffusion region should fall within a range of between 10 nm and 20 nm. Further, the thickness of the NiSi film should fall within a range of between 20 nm and 30 nm. Where the SiGe film is of a laminate structure including the first and second SiGe films, the thickness of the first SiGe film should be about 10 nm, and the thickness of the second SiGe film should be about 20 to 30 nm. On the other hand, where the SiGe film is formed to have a gradient in the Ge concentration, the thickness of the SiGe film should fall within a range of between 30 nm and 40 nm.

Incidentally, in the semiconductor device according to this embodiment of the present invention, Ge is segregated at a high concentration at the interface between the NiSi film and the source-drain contact region. As a result, it is possible to further decrease the contact resistance so as to improve the performance (driving force) of the transistor device.

FIGS. 9A to 9E are cross sectional views collectively showing the manufacturing process of a semiconductor device according to another embodiment of the present invention.

Figure 9A:
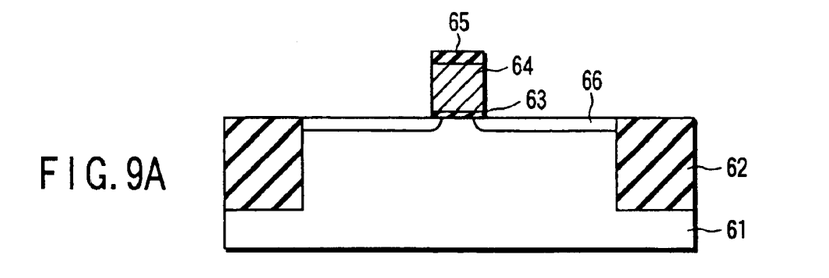
FIGS. 9A to 9E are cross sectional views collectively showing the manufacturing method of a semiconductor device according to another embodiment of the present invention.

In the first step, an isolation region 62 consisting of a silicon oxide film is formed on the surface of a semiconductor substrate 61 as shown in FIG. 9A. Also, a gate structure is formed on the semiconductor substrate by laminating a gate insulating film 63, a gate electrode 64 consisting of polysilicon and a gate electrode cap silicon nitride film 65. Then, a first diffusion region 66 is formed by implanting an impurity into the semiconductor substrate 61 with the gate structure used as a mask.

Figure 9B:
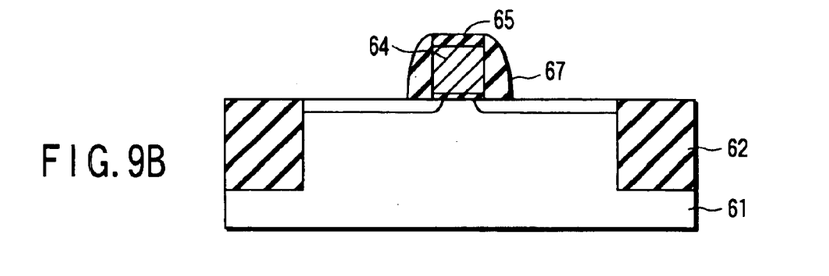
Figure 9C:
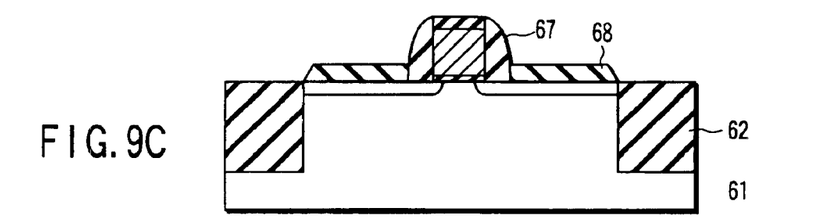

In the next step, a sidewall insulating film 67 is formed to surround the gate electrode 64 as shown in FIG. 9B, followed by selectively forming a C-containing SiGe film 68 as shown in FIG. 9C. The C-containing SiGe film 68 can be formed as follows. Specifically, $CH_3SiH_3$ is added to a mixed gas of $SiH_2Cl_2$ and $GeH_4$ providing the gas species used for the selective Si growth. It is desirable for the thickness of the C-containing SiGe film 68, which can be determined appropriately in accordance with, for example, the concentrations of Ge and C contained in the film, to be about 2 to 20 nm.

Figure 9D:
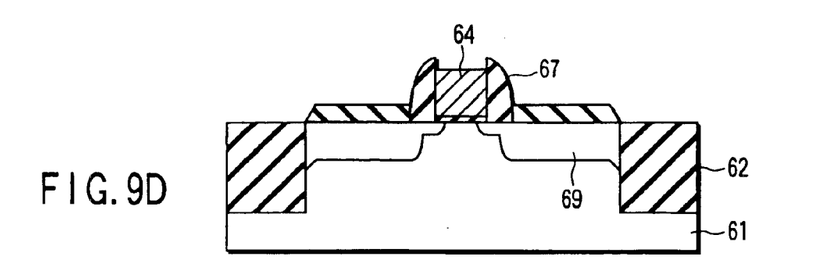

In the next step, the gate electrode cap silicon nitride film 65 is removed, followed by implanting an impurity into the semiconductor substrate, as shown in FIG. 9D. As a result, a second diffusion region 69 is formed within the semiconductor substrate 61. In this step, the impurity is also introduced into the gate electrode 64 and the C-containing SiGe film 68.

Figure 9E:
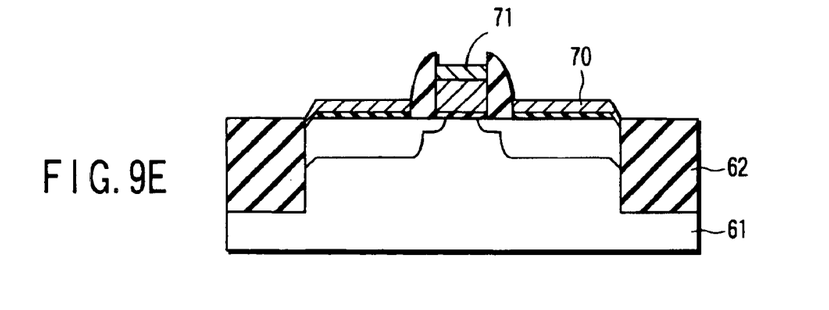

Further, a metal film (not shown) such as a Ni film for forming a silicide is deposited on the entire surface of the resultant structure, followed by applying a heat treatment to the deposited metal film. Finally, the excess portion of the metal film is selectively removed, with the result that silicide films 70 and 71 are formed on the surface of the gate electrode 44 and on the surface of the C-containing SiGe film 68, respectively. It should be noted that the silicide film 70 formed on the surface of the C-containing SiGe film 68 contains Ge and C.

The presence of C referred to above causes the silicidation not to proceed locally in the silicide film 70 so as to make it possible to form flat the silicide film 70 with a uniform composition. As a result, the flatness of the interface between the silicide film 70 and the SiGe film 69 underlying the silicide film 70 is promoted so as to improve the film morphology. In order to ensure the particular effect sufficiently, it is desirable for the C concentration in the C-containing SiGe film 68 to be at least 0.1 atomic %. It should be noted, however, that, if C is contained in an excessively large amount, it is possible for C to fail to form a solid solution within SiGe. Alternatively, precipitation of C or SiC tends to take place, which generates defects within the crystal. In order to avoid such an inconvenience, it is desirable for the upper limit of the C content to be about 4 atomic %. Also, it is not absolutely necessary for the C concentration to be uniform within the silicide film. In other words, it is possible to change the C concentration in accordance with the Ge content.

A dielectric film (not shown) is deposited by the ordinary method on each of the silicide films 70 and 71 so as to form contact holes. Then, a conductive material is buried in each of these contact holes so as to form an interconnect layer (not shown), thereby finishing the manufacture of the semiconductor device according to another embodiment of the present invention.

In the semiconductor device thus manufactured, the silicide film having a low resistivity has an excellent flatness and, thus, it is possible to obtain satisfactory characteristics such as a low junction leak in the regions in which the silicide films are formed.

It is possible to form the silicide film described above not only on the impurity diffusion region but also on the gate electrode. In this case, the silicon nitride film 45 and the silicon oxide film 46 are not formed in the structure shown in, for example, FIG. 7A so as to permit the surface of the gate electrode 44 to be exposed to the outside. Then, the process steps described previously with reference to FIGS. 7B to 7H are carried out successively, except that the gate structure is formed as described above. In this case, the SiGe film 49 and the metal silicide film 54 are also formed on the gate electrode 44.

Alternatively, the surface of the gate electrode 64 is left exposed to the outside without forming the silicon nitride film 65 and the silicon oxide film 66 in the structure shown in FIG. 9A. Then, the process steps described previously with reference to FIGS. 9B to 9E are carried out successively, except that the gate structure is formed as described above. In this case, the SiGe film 68 and the metal silicide film 70 are also formed on the gate electrode 64.

In each of the cases described above, it is possible to improve markedly the film morphology of the silicide film.

As described above, according to one embodiment of the present invention, it is possible to provide a semiconductor device with a suppressed parasitic resistance while suppressing the generation of the junction leak defect and the gate insulating film defect. Also, according to another embodiment of the present invention, it is possible to provide a method of manufacturing a semiconductor device with a suppressed parasitic resistance while suppressing the generation of the junction leak defect and the gate insulating film defect.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device; comprising:
    a semiconductor substrate;
    an isolation region formed within the semiconductor substrate to define an active region;
    a pair of impurity diffusion regions formed within the active region in contact with the isolation regions, the impurity diffusion regions having surfaces elevated from the isolation region;
    a SiGe film formed on an upper surface of the impurity diffusion region so as to cover partly the side surface of the impurity diffusion region, a Ge concentration in the SiGe film being higher at a lower surface of the SiGe film than at an upper surface of the SiGe film;
    a metal silicide layer formed on the SiGe film; and
    a gate electrode formed in the active region of the semiconductor substrate with a gate insulating film interposed therebetween and having a sidewall insulating film formed on the side surface.

2. The semiconductor device according to claim 1, further comprising an insulating film formed between the sidewall insulating film and the metal silicide film and another insulating film formed between the SiGe film covering the side surface of the impurity diffusion region and the isolation region.

3. The semiconductor device according to claim 1, wherein the upper surface of the metal silicide film is positioned lower than the upper surface of the gate electrode.

4. The semiconductor device according to claim 1, wherein the metal silicide film contains Ni.

5. The semiconductor device according to claim 1, wherein the maximum thickness of the SiGe film covering the side surface of the impurity diffusion region is not larger than the distance between the surface of the isolation region and the surface of the impurity diffusion region.

6. The semiconductor device according to claim 1, wherein the gate electrode includes a polysilicon layer and a SiGe film and a metal silicide layer formed successively on the polysilicon layer.

7. The semiconductor device according to claim 1, wherein the semiconductor substrate is a silicon substrate.

8. A semiconductor device, comprising:
    a semiconductor substrate containing a silicon atom at least in a surface;

an isolation region formed within the semiconductor substrate to define an active region;

a pair of impurity diffusion regions formed within the active region in contact with the isolation region;

a C-containing SiGe film formed on upper surfaces of the pair of the impurity diffusion regions, a C concentration in the C-containing SiGe film being not lower than 0.1 atomic %;

a C-containing metal silicide layer formed on the C-containing SiGe film; and a gate electrode formed in the active region of the semiconductor substrate with a gate insulating film interposed therebetween and having a sidewall insulating film formed on the side surface thereof.

9. The semiconductor device according to claim 8, wherein the C-containing metal silicide layer contains Ni.

10. The semiconductor device according to claim 8, wherein the gate electrode includes a polysilicon layer and a SiGe film and a metal silicide layer formed successively on the polysilicon layer.

11. The semiconductor device according to claim 8, wherein the semiconductor substrate is a silicon substrate.

12. A method for manufacturing a semiconductor device, comprising:

forming a gate electrode above an active region of a semiconductor substrate separated by an isolation region, with a gate insulating film interposed between the active region and the gate electrode;

forming a sidewall insulating film on the side surface of the gate electrode;

forming an impurity diffusion region by introducing an impurity into the semiconductor substrate, with the sidewall insulating film and the gate electrode used as a mask;

removing an upper portion of the isolation region so as to partially expose a side surface of the impurity diffusion region to the outside;

forming a SiGe film on an upper surface of the impurity diffusion region so as to cover partly the side surface of the impurity diffusion region, a Ge concentration in the SiGe film being higher at a lower surface of the SiGe film than at an upper surface of the SiGe film;

forming a metal film on the entire surfaces of the SiGe film and the gate electrode;

applying a heat treatment to the semiconductor substrate having the metal film formed thereon so as to convert an upper region of the SiGe film into a metal silicide layer selectively, a lower region of the SiGe film being left unchanged;

forming a dielectric film as a pre-metal dielectric on the entire surface of the semiconductor substrate having the metal silicide layer formed thereon;

forming a contact hole in the dielectric film, followed by filling the contact hole with a conductive material; and forming an interconnect layer connected to said conductive material filled in the contact hole.

13. The method for manufacturing a semiconductor device according to claim 12, wherein the SiGe film is formed at a height not exceeding the upper surface of the gate electrode.

14. The method for manufacturing a semiconductor device according to claim 12, wherein the metal silicide layer is formed to permit the distance between the lower surface of the gate insulating film and the lower surface of the metal silicide layer falls within a range of between 5 nm and 20 nm.

15. The method for manufacturing a semiconductor device according to claim 12, wherein the SiGe film is formed by successively depositing a first SiGe film containing a high concentration of Ge and a second SiGe film containing a low concentration of Ge.

16. The method for manufacturing a semiconductor device according to claim 12, wherein the Ge concentration in the first SiGe film falls within a range of between 15 and 30 atomic %.

17. The method for manufacturing a semiconductor device according to claim 12, wherein the Ge concentration in the second SiGE film falls within a range of between 5 and 20 atomic %.

18. The method for manufacturing a semiconductor device according to claim 12, wherein the SiGe film is formed of a SiGe film having a gradient in the Ge concentration such that the Ge concentration is lowered toward the surface of the SiGe film.

19. The method for manufacturing a semiconductor device according to claim 18, wherein the Ge concentration on the lower surface of the SiGe film is not higher than 30 atomic % and the Ge concentration on the upper surface is not lower than 5 atomic %.

20. The method for manufacturing a semiconductor device according to claim 12, wherein the gate electrode is formed of polysilicon, and the SiGe film having the metal silicide layer in the upper portion is also formed on the gate electrode.

21. The semiconductor device according to claim 8, wherein:

the pair of impurity diffusion regions is formed within the semiconductor substrate, and an upper surface of the pair of impurity diffusion regions is flush with a surface of the semiconductor substrate.

22. The semiconductor device according to claim 8, wherein a C concentration in the C-containing SiGe film is not more than 4 atomic %.

* * * * *